United States Patent
Chae

(10) Patent No.: US 8,212,369 B2
(45) Date of Patent: Jul. 3, 2012

(54) SEMICONDUCTOR WAFER COATED WITH A FILLED, SPIN-COATABLE MATERIAL

(75) Inventor: Eunsook Chae, San Diego, CA (US)

(73) Assignee: Henkel AG & Co. KGaA, Duesseldorf (DE)

( * ) Notice: Subject to any disclaimer, the term of this patent is extended or adjusted under 35 U.S.C. 154(b) by 270 days.

(21) Appl. No.: 12/512,606

(22) Filed: Jul. 30, 2009

(65) Prior Publication Data

US 2010/0193973 A1 Aug. 5, 2010

Related U.S. Application Data

(63) Continuation of application No. PCT/US2007/002740, filed on Jan. 31, 2007.

(51) Int. Cl.
*H01L 23/29* (2006.01)
(52) U.S. Cl. .................. 257/789; 257/E23.121
(58) Field of Classification Search .................. 257/789, 257/E21.502, E23.121, 787, 788
See application file for complete search history.

(56) References Cited

U.S. PATENT DOCUMENTS

| 3,924,323 | A | * | 12/1975 | Trevail et al. ................... 438/17 |
| 6,051,778 | A | * | 4/2000 | Ichinose et al. ............... 136/256 |
| 6,716,674 | B2 | | 4/2004 | Yajima et al. |
| 7,262,511 | B2 | | 8/2007 | Osako et al. |
| 2004/0012098 | A1 | * | 1/2004 | Yamazaki et al. ............. 257/778 |

FOREIGN PATENT DOCUMENTS

| JP | 11121538 A | 4/1999 |
| JP | 2001181482 A | 7/2001 |
| JP | 2003347321 A | 12/2003 |
| JP | 2004168870 A | 6/2004 |
| JP | 2004211053 A | 7/2004 |
| JP | 200696873 A | 4/2006 |

\* cited by examiner

*Primary Examiner* — Victor A Mandala
*Assistant Examiner* — Selim Ahmed
(74) *Attorney, Agent, or Firm* — Jane E. Gennaro

(57) ABSTRACT

This invention is a semiconductor wafer having an active side and a back side opposite the active side, which back side is coated with a filled, spin-coatable coating, wherein the coating comprises a resin and a spherical filler characterized by an average particle diameter of greater than 2 μm and a single peak particle size distribution. In another embodiment the invention is a method for producing a spin-coatable, B-stage-able coating with a thixotropic index of 1.2 or less. In a third embodiment the invention is a method for producing a coated semiconductor wafer.

8 Claims, No Drawings

SEMICONDUCTOR WAFER COATED WITH A FILLED, SPIN-COATABLE MATERIAL

CROSS-REFERENCE TO RELATED APPLICATIONS

This application is a continuation of International Application No. PCT/US2007/002740 filed Jan. 31, 2007, the contents of which are incorporated herein by reference.

FIELD OF THE INVENTION

This invention relates to a semiconductor wafer coated with a filled, spin-coatable coating on the inactive or backside surface.

BACKGROUND OF THE INVENTION

Recent advancements in semiconductor packaging have led to the development of the "stacked" package, in which two or more semiconductor dies are mounted on top of one another within a single semiconductor package. This stacking of dies enables increased functionality in a small footprint, allowing for downsizing of the overall semiconductor package. Typically, an adhesive paste or film is used between the two semiconductor dies to ensure package integrity during fabrication operations such as wirebonding, molding, and solder reflow, and during end use.

There are various methods of assembling a package in a stacked configuration. Each die contains a number of electrical terminals, from which metal, usually gold, wires extend to electrical terminals on a substrate. In a stacked package the wire bonds from one die must avoid contact with and damage to the neighboring dies. Furthermore, the adhesive used to bond the dies to the substrate and/or to one another must not encroach on the wirebonding pads. As packages migrate to tighter tolerances in general, and in particular in stacked packages, there is a need for very tight control of the adhesive fillet, which typically protrudes from the edge of the bonded die.

One method that has been used to control the flow of the bonding adhesive is to utilize a tape or film instead of a paste adhesive. In this method the tape or film adhesive is applied to either the substrate or one of the dies. When applied to the dies, the adhesive film can be attached first to the wafer, which is then singulated into dies, or it can be applied directly to previously singulated dies. The die is then attached to its substrate and bonded through the use of heat and pressure. This provides the required flow characteristics for the stacked package, with minimal fillet formation around the periphery of the die. However, tapes and films are very expensive compared to traditional paste die attach adhesives and it would be preferable to utilize a paste, or liquid type adhesive that could be applied to the wafer and then partially cured or dried (B-staged) to enable further processing.

One known method of coating a wafer is spin coating. This method has the advantage of speed and has been successfully utilized with adhesives containing minimal filler, typically less than 10% by weight. Higher filler loadings are desirable, however, for a number of purposes, including stress reduction, control of modulus or coefficient of thermal expansion, reduced moisture absorption, reinforcement of the material by improving cohesive strength, electrical and/or thermal conductivity, reduced volatility, and flow control. Although useful for these functions, higher filler loadings can lead to a loss in uniformity of coating thickness, resulting in a thicker coating in the center of the wafer as compared to the outer edges. This lack of uniformity in coating thickness is undesirable for current subsequent processing steps including dicing and die attach.

This invention provides a solution to the above problem by providing a semiconductor wafer that is coated with a filled, spin-coatable material that has good uniformity of coating thickness.

SUMMARY OF THE INVENTION

This invention is a semiconductor wafer comprising a semiconductor wafer having an active side and a back side opposite the active side, and a coating disposed on the back side of the wafer, which coating comprises (a) a resin system, and (b) spherical filler having an average particle diameter of greater than 2 μm and a single peak particle size distribution.

In another embodiment this invention is a method of producing a spin-coatable, B-stageable coating with a thixotropic index of 1.2 or less comprising (a) providing a resin system comprising (i) a solid epoxy resin and (ii) a liquid selected from the group consisting of a monofunctional acrylate monomer, an organic solvent, or a combination of those, and (b) adding to the resin from 10 to 30 wt % spherical filler having an average particle diameter of greater than 2 μm and a single peak particle size distribution.

In another embodiment this invention is a method of producing a coated semiconductor wafer in which the semiconductor wafer has an active side and a back side opposite the active side comprising (a) providing a coating composition comprising (i) a solid epoxy resin and (ii) a liquid selected from the group consisting of a monofunctional acrylate monomer, an organic solvent, or a combination of those, and (iii) 10 to 30 wt % spherical filler having an average particle diameter of greater than 2 μm and a single peak particle size distribution; (b) spin-coating the coating composition onto the back side of the wafer; and (c) B-staging the coating.

DEFINITIONS

The term "alkyl" as used herein refers to a branched or un-branched saturated hydrocarbon group of 1 to 24 carbon atoms, such as methyl ("Me"), ethyl ("Et"), n-propyl, isopropyl, n-butyl, isobutyl, t-butyl, octyl, decyl, and the like.

The term "effective amount" of a compound, product, or composition as used herein is meant a sufficient amount of the compound, product or composition to provide the desired results. As will be pointed out below, the exact amount required will vary from package to package, depending on the particular compound, product or composition used, its mode of administration, and the like. Thus, it is not always possible to specify an exact amount; however, an effective amount may be determined by one of ordinary skill in the art using only routine experimentation.

As used herein, the term "suitable" refers to a moiety that is compatible with the compounds, products, or compositions as provided herein for the stated purpose. Suitability for the stated purpose may be determined by one of ordinary skill in the art using only routine experimentation.

As used herein, "substituted" is used to refer, generally, to a carbon or suitable heteroatom having a hydrogen atom or other atom removed and replaced with a further moiety. Moreover, it is intended that "substituted" refer to substitutions which do not change the basic and novel utility of the underlying compounds, products or compositions of the present invention.

As used herein, the term "B-staging" (and its variants) is used to refer to the processing of a material by heat or irradiation so that if the material is dissolved or dispersed in a solvent, the solvent is evaporated off with or without partial curing of the material, or if the material is neat with no solvent, the material is partially cured to a tacky or more hardened state. If the material is a flow-able adhesive, B-staging will provide extremely low flow without fully curing, such that additional curing may be performed after the adhesive is used to join one article to another. The reduction in flow may be accomplished by evaporation of a solvent, partial advancement or curing of a resin or polymer, or both.

As used herein the term "curing agent" is used to refer to any material or combination of materials that initiate, propagate, or accelerate cure of the composition and includes but is not limited to accelerators, catalysts, initiators, and hardeners.

As used herein the term "particle size" is used to refer to the largest dimension of the particle. For instance, if the particle is spherical the particle size is equivalent to the diameter of the particle, and if the particle is a flake the particle size is the length of the flake.

As used herein the term "thixotropic index" is used to refer to the ratio of low shear viscosity (tested at 0.5 rpm) to high shear viscosity (tested at 5.0 rpm). Unless otherwise stated, all testing was performed on a cone-plate type spindle viscometer.

DETAILED DESCRIPTION OF THE INVENTION

The semiconductor wafer may be any type, size, or thickness as required for the specific industrial use.

Suitable resins for use in the coating can be thermoset or thermoplastic and are any monomers, polymers, oligomers, or pre-polymers, or those materials dissolved in solvent, that are spin-coatable, that is, have a thixotropic index of 1.2 or less and a viscosity between 3,000 and 10,000 cP at 5.0 rpm. Exemplary resins include, but are not limited to, epoxies, acrylates, vinyl ethers, methacrylates, maleimides, nitrile butyl rubber, polyester, poly(butadienes), siliconized olefins, silicones, styrenes, and cyanate esters, polyolefins, or a combination of two or more of those. Thixotropic index is defined as the ratio of low shear viscosity (tested at 0.5 rpm) to high shear viscosity (tested at 5.0 rpm). Although the preferred viscosity for high volume manufacturing is between 3,000 and 10,000 cP at 5.0 rpm, higher viscosity formulations can be accommodated by spinning the wafer at a higher speed.

Although any resin system that meets the above criteria may be used in the spin-coatable coating, in a preferred embodiment the resin system comprises (i) solid epoxy resin, (ii) a curing agent, and (iii) a liquid selected from the group consisting of a monofunctional acrylate monomer and an organic solvent. This composition is particularly desirable in that the adhesive may be B-staged after it has been coated on the wafer. B-staging involves the exposure of the coated wafer to heat (typically 90° to 125° C. for 15 to 30 minutes) to evaporate solvent and/or partially cure the adhesive prior to additional processing steps such as storage, dicing, die pick up, and die bonding.

Suitable solid epoxy resins include but are not limited to cresol novolac epoxy, phenol novolac, and bis-A type epoxy. In this embodiment the solid epoxy resin comprises 15 to 30 wt % of the coating.

Examples of suitable maleimide resins include, but are not limited to, those commercially available from Dainippon Ink and Chemical, Inc. Other suitable maleimide resins are selected from the group consisting of

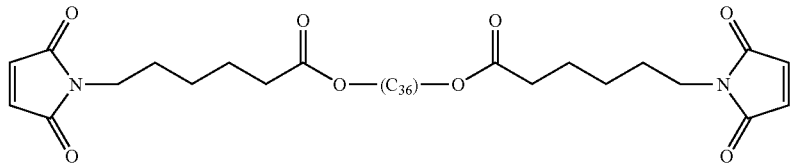

in which $C_{36}$ represents a linear or branched chain (with or without cyclic moieties) of 36 —$CH_2$— moieties;

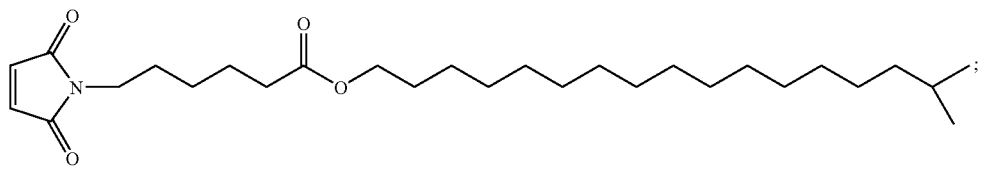

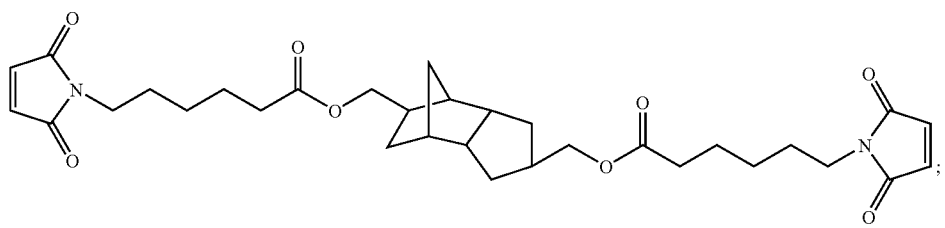

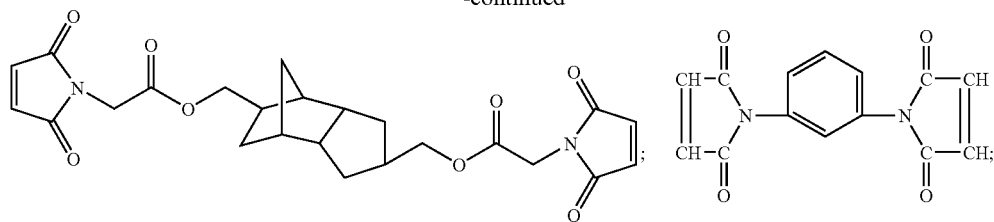

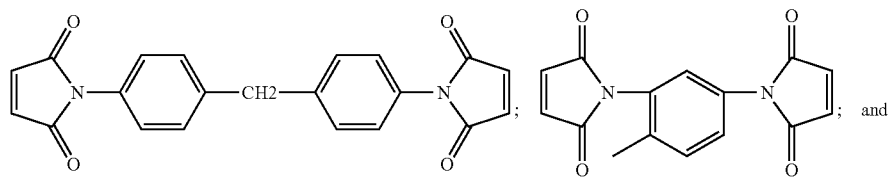

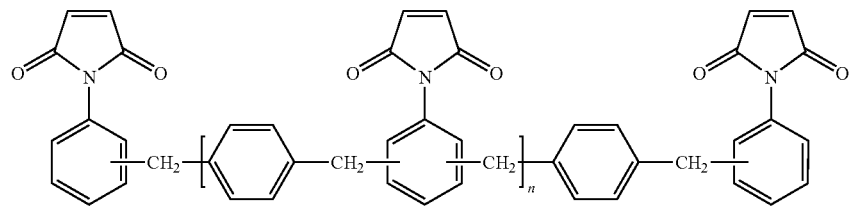

in which n is 1 to 5.

Examples of suitable acrylate resins include, but are not limited to, butyl(meth)acrylate, isobutyl(meth)acrylate, 2-ethyl hexyl(meth)acrylate, isodecyl(meth)acrylate, n-lauryl(meth)acrylate, alkyl(meth)acrylate, tridecyl(meth)acrylate, n-stearyl(meth)acrylate, cyclohexyl(meth)acrylate, tetrahydrofurfuryl(meth)acrylate, 2-phenoxy ethyl(meth)acrylate, isobornyl(meth)acrylate, 1,4-butanediol di(meth)acrylate, 1.6 hexanediol di(meth)acrylate, 1,9-nonandiol di(meth)acrylate, perfluorooctylethyl(meth)acrylate, 1,10 decandiol di(meth)acrylate, nonylphenol polypropoxylate (meth)acrylate, and polypentoxylate tetrahydrofurfuryl acrylate, available from Kyoeisha Chemical Co., LTD; polybutadiene urethane dimethacrylate (CN302, NTX6513) and polybutadiene dimethacrylate (CN301, NTX6039, PRO6270) available from Sartomer Company, Inc; polycarbonate urethane diacrylate (ArtResin UN9200A) available from Negami Chemical Industries Co., LTD; acrylated aliphatic urethane oligomers (Ebecryl 230, 264, 265, 270, 284, 4830, 4833, 4834, 4835, 4866, 4881, 4883, 8402, 8800-20R, 8803, 8804) available from Radcure Specialities, Inc; polyester acrylate oligomers (Ebecryl 657, 770, 810, 830, 1657, 1810, 1830) available from Radcure Specialities, Inc.; and epoxy acrylate resins (CN104, 111, 112, 115, 116, 117, 118, 119, 120, 124, 136) available from Sartomer Company, Inc.

In one embodiment the acrylate resins are selected from the group consisting of isobornyl acrylate, isobornyl methacrylate, lauryl acrylate, lauryl methacrylate, 4-hydroxybutyl glycidyl ether acrylate, poly(butadiene) with acrylate functionality and poly(butadiene) with methacrylate functionality. The acrylate is typically present in an amount of 15 to 50 wt %.

Examples of suitable vinyl ether resins include, but are not limited to, cyclohenanedimethanol divinylether, dodecylvinylether, cyclohexyl vinylether, 2-ethylhexyl vinylether, dipropyleneglycol divinylether, hexanediol divinylether, octadecylvinylether, and butanediol divinylether available from International Speciality Products (ISP); Vectomer 4010, 4020, 4030, 4040, 4051, 4210, 4220, 4230, 4060, 5015 available from Sigma-Aldrich, Inc. The vinyl ether is typically present in an amount of 15 to 50 wt %.

Examples of suitable poly(butadiene) resins include poly (butadienes), epoxidized poly(butadienes), maleic poly(butadienes), acrylated poly(butadienes), butadiene-styrene copolymers, and butadiene-acrylonitrile copolymers. Commercially available materials include homopolymer butadiene (Ricon130, 131, 134, 142, 150, 152, 153, 154, 156, 157, P30D, available from Sartomer Company Inc); random copolymer of butadiene and styrene (Ricon 100, 181, 184, available from Sartomer Company Inc.); maleinized poly (butadiene) (Ricon 130MA8, 130MA13, 130MA20, 131MA5, 131MA10, 131MA17, 131MA20, 156MA17, available from Sartomer Company Inc.); acrylated poly(butadienes) (CN302, NTX6513, CN301, NTX6039, PRO6270, Ricacryl 3100, Ricacryl 3500, available from Sartomer Inc.); epoxidized poly(butadienes) (Polybd 600, 605, available from Sartomer Company Inc.), (Epolead PB3600, available from Daicel Chemical Industries Ltd.); and acrylonitrile and butadiene copolymers (Hycar CTBN series, ATBN series, VTBN series and ETBN series, available from Hanse Chemical). The poly(butadiene) is typically present in an amount of 15 to 50 wt %.

The use of a curing agent is optional, depending on whether the resin system employed is capable of self-initiation, and depending on the cure speed and temperature desired. Curing agents suitable for use in the coating are present in an amount of between 0 and 5 wt % and include but are not limited to phenolics, aromatic diamines, dicyandiamides, peroxides, amines, imidizoles, tertiary amines, and polyamides. Suitable phenolics are commercially available from Schenectady International, Inc. Suitable aromatic diamines are primary diamines and include diaminodiphenyl sulfone and diaminodiphenyl methane, commercially available from Sigma-Aldrich Co. Suitable dicyandiamides are available from SKW Chemicals, Inc. Suitable polyamides are commercially available from Air Products and Chemicals, Inc. Suitable imidazoles are commercially available from Air Products and Chemicals, Inc. Suitable tertiary amines are available from Sigma-Aldrich Co. Suitable peroxides include benzoyl peroxide, tert-butyl peroxide, lauroyl peroxide, cumene hydroperoxide, cyclohexanone peroxide, butyl peroctoates and dicumyl peroxide. Additional curing agents that are suitable include azo compounds, such as 2,2'-azobis(2-methyl-propanenitrile), 2,2'-azobis(2-methyl-butanenitrile), 4,4-azobis(4-cyanovaleric acid), 1,1'-azobis(cyclohexanecarbonitrile), and 2,2'-azobisisobutyronitrile.

Fillers that are suitable for use in the coating are spherical in shape with an average particle diameter of greater than 2 μm and a single peak particle size distribution. Smaller particle sizes and bimodal distributions result in an unacceptably high thixotropic index, which in turn leads to poor spin coating performance and non-uniform coating thickness.

Examples of suitable nonconductive fillers include alumina, aluminum hydroxide, silica, vermiculite, mica, wollastonite, calcium carbonate, titania, sand, glass, barium sulfate, zirconium, carbon black, organic fillers, and organic polymers including but not limited to halogenated ethylene polymers, such as, tetrafluoroethylene, trifluoroethylene, vinylidene fluoride, vinyl fluoride, vinylidene chloride, and vinyl chloride. Examples of suitable conductive fillers include carbon black, graphite, gold, silver, copper, platinum, palladium, nickel, aluminum, silicon carbide, boron nitride, diamond, and alumina. The particular type of filler is not critical and can be selected by one skilled in the art to suit the needs of the specific end use, such as stress reduction and bondline control. Spacers may also be included in the formulation to control the bondline thickness of the bonded part, in types and amounts selected by the practitioner to meet the needs of the particular application. Filler may be present in any amount determined by the practitioner to be suitable for the chosen resin system and end use and typically ranges between 10 and 30 wt %.

Other additives, including but not limited to adhesion promoters, antifoaming agents, antibleed agents, rheology control agents, and fluxing agents, in types and amounts known to those skilled in the art, may be included in the coating formulation.

The coating can be any thickness required for the appropriate protection, bonding, or processing performance for the particular manufacturing use and would typically be between 12 and 60 μm.

EXAMPLES

Example 1

Effect of Rheology on Coating Performance

Coating formulations were prepared with various high and low shear viscosities, to illustrate the effect of viscosity and thixotropic index on coating performance. Comparative Formulation A was designed to have a high thixotropic index and high viscosity. Comparative Formulation B was designed to have a high thixotropic index and low viscosity. Inventive Formulations C and D both had a low thixotropic index, with high and low viscosity, respectively. The coatings were prepared using standard adhesive manufacturing techniques, according to the formulations listed in Table 1 below. The filler utilized in each of these formulations was spherical silica with an average particle diameter of 2.6 □m and a single peak particle size distribution.

TABLE 1

COMPOSITION OF COMPARATIVE FORMULATIONS A AND B AND INVENTIVE FORMULATIONS C AND D

|  | Comp A | Comp B | Inv C | Inv D |
| --- | --- | --- | --- | --- |
| Monofunctional acrylate resin (1), wt % | 13.7 | 20.2 | 22.5 | 17.5 |
| Monofunctional acrylate resin (2), wt % | 12.8 | 11.0 | 16.25 | 21.25 |
| Peroxide curing agent, wt % | 0.6 | 1.12 | 1.0 | 1.0 |
| Solid epoxy resin, wt % | 15.5 | 19.2 | 18.75 | 18.75 |
| CTBN rubber, wt % | 22.0 | 16.8 | 10.0 | 10.0 |
| Dicyandiamide curing agent, wt % | 0.4 | 0.56 | 0.35 | 0.5 |
| Imidizole accelerator, wt % |  |  | 0.15 |  |
| Antifoaming agent, wt % |  | 1.12 | 1.0 | 1.0 |
| Filler, wt % | 35 | 30 | 30 | 30 |

The coating formulations were tested for high and low shear viscosity at room temperature and thixotropic index was calculated for each. The coatings were then spin coated onto a 20.3 cm diameter wafer at 1000 rpm for 60 seconds at room temperature and the coated wafer was B-staged at 110° C. for 30 minutes. Each formulation was evaluated for spin-coatability by measuring the height of the coating in the center of the wafer and comparing that to the height of the coating approximately 1 inch from the outside edge of the wafer. If the difference between the height near the outside edge and the height in the middle was less than 15% of the height near the outside edge the formulation was said to be spin-coatable. That is, the formulation gave satisfactory uniformity of thickness across the surface of the wafer (did not "dome" in the center). The viscosity, thixotropic index, and coating thickness data are summarized in Table 2 below.

TABLE 2

VISCOSITY, THIXOTROPIC INDEX, AND THICKNESS ON COATED WAFERS FOR COMPARATIVE FORMULATIONS A AND B AND INVENTIVE FORMULATIONS C AND D

|  | Comp A | Comp B | Inv C | Inv D |
|---|---|---|---|---|
| Viscosity @ 0.5 rpm, cP | 49,152 | 9,011 | 13,926 | 5,734 |
| Viscosity @ 5.0 rpm, cP | 25,641 | 4,669 | 15,647 | 4,833 |
| Thixotropic Index | 1.9 | 1.9 | 0.9 | 1.2 |
| Edge Coating Thickness, mm | 0.08 | 0.02 | 0.09 | 0.0296 |
| Center Coating Thickness, mm | 0.226 | 0.237 | 0.103 | 0.03382 |
| Coating Thickness Difference, mm | 0.146 | 0.217 | 0.013 | 0.00422 |
| Coating Thickness Difference, % | 182 | 1090 | 14.4 | 14.3 |
| Spin Coatable? | No | No | Yes | Yes |

The comparative formulations, with high thixotropic index (greater than 1.2), were not spin coatable since they "domed" in the center, with center thickness more than 15% higher than the thickness near the edge of the wafer. As might be expected, viscosity did have an effect on coating thickness since all samples were coated at the same speed and for the same length of time, with the higher viscosity materials giving a thicker overall coating. However, viscosity did not have an effect on spin-coatability, as both inventive formulations (thixotropic index 1.2 or less) gave good uniformity of thickness across the surface of the wafer.

For examples 2-5, a coating was formulated with the following model composition, using standard adhesive manufacturing techniques:

| | |
|---|---|
| Monofunctional acrylate resin (1) | 12.1 wt % |
| Monofunctional acrylate resin (2) | 18.2 wt % |
| Peroxide curing agent | 0.5 wt % |
| Solid epoxy resin | 18.15 wt % |
| CTBN rubber | 18.15 wt % |
| Dicyandiamide curing agent | 1.2 wt % |
| Imidizole accelerator | 0.3 wt % |
| Epoxy functional silane | 0.7 wt % |
| Antifoaming agent | 0.7 wt % |
| Filler | 30 wt % |

The filler type was varied to show the effect of filler size, distribution, and shape on viscosity, thixotropic index, and spin coatability. High shear viscosity (at 5 rpm) was reported as viscosity and the ratio of low shear viscosity to high shear viscosity (at 0.5 rpm/at 5 rpm) was reported as thixotropic index.

Each formulation was spin coated onto a 20.3 cm wafer at 1000 rpm for 60 seconds at room temperature to a target thickness of 25 μm or 60 μm and the coated wafer was B-staged at 110° C. for 30 minutes. Each formulation was evaluated for spin-coatability by measuring the height of the coating in the center of the wafer and comparing that to the height of the coating about 1" from the outside edge of the wafer. If the difference between the two heights was less than 15% of the thickness near the edge, the formulation was considered spin-coatable.

Example 2

Effect of Filler Type

TABLE 3

EFFECT OF FILLER TYPE ON SPIN COATING

| Filler | Shape | Size (μm) | Size Distribution | Type | Viscosity (cP) | Thixotropic Index | Spin-coatable |
|---|---|---|---|---|---|---|---|
| Inv E | Spherical | 2.6 | Single | Silica | 4,888 | 0.8 | Yes |
| Inv F | Spherical | 6 | Single | Polymer | 4,774 | 0.6 | Yes |

Inventive formulations E (silica filler) and F (polymer filler) were both spin-coatable, indicating filler type did not affect spin coatability.

Example 3

Effect of Filler Particle Size Distribution

TABLE 4

EFFECT OF FILLER PARTICLE SIZE DISTRIBUTION ON SPIN COATING

| Filler | Shape | Size (μm) | Size Distribution | Type | Viscosity (cP) | Thixotropic Index | Spin-coatable |
|---|---|---|---|---|---|---|---|
| Inv E | Spherical | 2.6 | Single | Silica | 4,888 | 0.8 | Yes |
| Comp G | Spherical | 4.4 | Bimodal | Silica | 3,315 | 1.5 | No |

Example 3 illustrates the effect of filler particle size distribution. Comparative formulation G, which had a filler with a similar size and shape to that used for inventive formulation E, was not spin-coatable because its bimodal distribution resulted in a thixotropic index above 1.2.

Example 4

Effect of Filler Size

TABLE 5

EFFECT OF FILLER SIZE ON SPIN COATING

| Filler | Shape | Size (μm) | Distribution | Type | Viscosity (cP) | Thixotropic Index | Spin-coatable |
|---|---|---|---|---|---|---|---|
| Inv E | Spherical | 2.6 | Single | Silica | 4,888 | 0.8 | Yes |
| Comp H | Spherical | 1.13 | Single | Silica | 5,243 | 1.6 | No |

Example 4 illustrates the effect of filler size. Comparative formulation H, which had a filler with an average particle diameter of less than 2 μm, was not spin-coatable because the smaller particle size resulted in a thixotropic index above 1.2.

Example 5

Effect of Filler Shape

TABLE 6

EFFECT OF FILLER SHAPE ON SPIN COATING

| Filler | Shape | Size (μm) | Distribution | Type | Viscosity (cP) | Thixotropic Index | Spin-coatable |
|---|---|---|---|---|---|---|---|
| Inv I | Spherical | 5.0 | Single | Crosslinked PMMA | 9102 | 1.2 | Yes |
| Comp J | Non-spherical | 5.7 | Trimodal | PEEK | 10,294 | 1.4 | No |
| Comp K | Non-spherical | 6.0 | Single | PTFE | 6,794 | 2.0 | No |

Example 5 illustrates the effect of filler shape. The fillers used for comparative formulations J and K (poly(ethyletherketone) and poly(tetrafluoroethylene), respectfully) had non-spherical shapes. These formulations were not spin-coatable because the non-spherical fillers resulted in a thixotropic index above 1.2. Inventive formulation I, which utilized spherical crosslinked poly(methylmethacrylate), had a thixotropic index below 1.2 and was therefore spin-coatable.

Example 6

Effect of Filler Content

Example formulations were prepared with varied filler content to illustrate the effect of filler loading on viscosity, thixotropic index, and resulting spin coatability. All the formulations for Example 6 were prepared using spherical silica filler with an average particle size of 2.6 μm and a single peak particle size distribution. Tables 7 and 8 present the formulations and results, respectively.

TABLE 7

EXAMPLE 6 - EFFECT OF FILLER CONTENT - FORMULATIONS (WT %)

| | Inv L | Inv M | Inv M | Inv O | Comp P | Comp Q |
|---|---|---|---|---|---|---|
| Mono-functional Acrylate (1) | 15.56 | 13.83 | 12.97 | 12.10 | 11.24 | 10.37 |
| Mono-functional Acrylate (2) | 23.23 | 20.74 | 19.45 | 18.15 | 16.85 | 15.56 |
| Peroxide | 0.62 | 0.55 | 0.52 | 0.48 | 0.45 | 0.51 |
| Solid Epoxy Resin | 23.34 | 20.74 | 19.45 | 18.15 | 16.85 | 15.56 |
| CTBN Rubber | 23.34 | 20.74 | 19.45 | 18.15 | 16.85 | 15.56 |
| Dicyandiamide Curing Agent | 1.56 | 1.38 | 1.30 | 1.21 | 1.12 | 1.04 |
| Imidizole Accelerator | 0.39 | 0.35 | 0.32 | 0.3 | 0.28 | 0.26 |
| Epoxy Functional Silane | 0.93 | 0.83 | 0.78 | 0.73 | 0.67 | 0.62 |
| Antifoaming Agent | 0.93 | 0.83 | 0.78 | 0.73 | 0.67 | 0.62 |
| Filler | 10 | 20 | 25 | 30 | 35 | 40 |

TABLE 8

EXAMPLE 6 - EFFECT OF FILLER LOADING ON SPIN COATING

| Formulation | Loading, wt % | Viscosity (cP) | Thixotropic Index | Spin-coatable |
|---|---|---|---|---|
| Inv L | 10 | 3065 | 0.54 | Yes |
| Inv M | 20 | 3065 | 0.54 | Yes |
| Inv N | 25 | 4142 | 0.8 | Yes |

TABLE 8-continued

EXAMPLE 6 - EFFECT OF FILLER LOADING ON SPIN COATING

| Formulation | Loading, wt % | Viscosity (cP) | Thixotropic Index | Spin-coatable |
|---|---|---|---|---|
| Inv O | 30 | 4888 | 0.85 | Yes |
| Inv P | 35 | 6131 | 1.22 | No |
| Inv Q | 40 | 7539 | 1.32 | No |

In this resin system and with this filler the formulation was spin-coatable with a loading of up to 30 wt % filler. It should be noted that the effective limit for filler loading will depend on the specific resin system and filler employed, and could be higher or lower, as determined by the practitioner for a specific industrial use.

Many modifications and variations of this invention can be made without departing from its spirit and scope, as will be apparent to those skilled in the art. The specific embodiments described herein are offered by way of example only, and the invention is to be limited only by the terms of the appended claims, along with the full scope of equivalents to which such claims are entitled.

What is claimed:

1. A semiconductor wafer having an active side and a back side opposite the active side wherein the back side is coated with a coating between 12 and 60 μm thick and wherein the difference between the height of the coating near the outside edge of the wafer and the height of the coating in the middle of the wafer is less than 15% of the height of the coating near the outside edge of the wafer, which coating comprises (a) a resin and
(b) a spherical filler having an average particle diameter of greater than 2 μm and a single peak particle size distribution, the filler present in an amount of between 10 and 30 wt % of the coating.

2. The semiconductor wafer of claim 1 in which the resin is selected from the group consisting of solid epoxy, liquid epoxy, acrylate, methacrylate, maleimide, vinyl ether, polyester, poly(butadiene), siliconized olefin, silicone, styrene, cyanate ester, and a combination of two or more of those.

3. The semiconductor wafer of claim 1 wherein the resin comprises (i) a solid epoxy resin and (ii) a liquid selected from the group consisting of a monofunctional acrylate monomer, an organic solvent, and a combination of those.

4. The semiconductor wafer of claim 3 wherein the liquid is present in an amount of between 15 and 50 wt % of the coating.

5. The semiconductor wafer of claim 3 wherein the liquid is the monofunctional acrylate monomer is isobornyl acrylate.

6. The semiconductor wafer of claim 3 wherein the liquid is an organic solvent is selected from the group consisting of 4-hydroxybutylacrylate glycidyl ether, methyl ethyl ketone, and carbitol acetate.

7. The semiconductor wafer of claim 3 wherein the solid epoxy resin is present in an amount of between 15 and 30 wt % of the coating.

8. The semiconductor wafer of claim 7 wherein the solid epoxy resin is a cresol novolac epoxy.

* * * * *